(12) United States Patent
Pan et al.

(10) Patent No.: US 7,012,559 B1
(45) Date of Patent: Mar. 14, 2006

(54) HIERARCHICAL PARALLEL PIPELINED OPERATION OF ANALOG AND DIGITAL CIRCUITS

(75) Inventors: Hui Pan, Irvine, CA (US); Ichiro Fujimori, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/948,547

(22) Filed: Sep. 24, 2004

(51) Int. Cl.
*H03M 1/38* (2006.01)

(52) U.S. Cl. .................. 341/161; 341/159; 341/158

(58) Field of Classification Search ............... 341/161, 341/159, 158

See application file for complete search history.

(56) References Cited

U.S. PATENT DOCUMENTS

| | | | | |
|---|---|---|---|---|
| 5,784,631 | A * | 7/1998 | Wise | 341/65 |
| 6,697,005 | B1 * | 2/2004 | Mulder | 341/156 |
| 6,784,818 | B1 * | 8/2004 | Mulder | 341/154 |
| 6,928,600 | B1 * | 8/2005 | Li et al. | 714/775 |

OTHER PUBLICATIONS

Conroy, Cormac S.G. et al., An 8-b 85-MS/s Parallel Pipeline A/D Converter in 1-$\mu$m CMOS, IEEE Journal of Solid-State Circuits, vol. 28, No. 4, Apr. 1993, pp 447-454.
Poulton, Ken et al., A 20GS/s 8b ADC with a 1MB Memory in 0.18$\mu$m CMOS, 2003 IEEE International Solid-State Circuits Conference, ISSCC 2003 / Session 18/NYQUIST A/D Converters / Paper 18/1, 10 pp., no month.

* cited by examiner

*Primary Examiner*—Don Le
*Assistant Examiner*—Lam T Mai
(74) *Attorney, Agent, or Firm*—Sterne, Kessler, Goldstein & Fox, P.L.L.C.

(57) ABSTRACT

A hierarchical parallel pipelined circuit includes a first stage with a plurality of sampling circuits and a plurality of corresponding analog or digital circuits that receive an output from the plurality of sampling circuits. A second stage includes a second plurality of sampling circuits and a plurality of corresponding analog or digital circuits that receive an output from the plurality of sampling circuits. A multi-frequency, multi-phase clock clocks the first and second stages, the multi-frequency, multi-phase clock providing a first clock having a first frequency having either a single or plurality of phases, and a second clock having a second frequency having a plurality of phases. A first phase of a plurality of phases is phase locked to the first phase of the first clock. The clock frequency multiplied by the number of parallel devices in each stage is the throughput of the circuit and is kept constant across the stages.

45 Claims, 11 Drawing Sheets

US 7,012,559 B1

HIERARCHICAL PARALLEL PIPELINED OPERATION OF ANALOG AND DIGITAL CIRCUITS

BACKGROUND OF THE INVENTION

1. Field of the Invention

The present invention is related to high-throughput discrete-time systems with parallel pipelined architectures, and more particularly, to high-speed analog front-end circuits, such as time-interleaved analog-to-digital converters and to programmable gain amplifiers that precede the analog-to-digital converters.

2. Related Art

Many modern data communications systems use parallel pipelined architectures in order to increase the data throughput. In essence, this approach utilizes a number of identical pipelined sub-circuits arranged in parallel. Another term for this architecture is "time interleaving."

FIG. 1A illustrates a conventional time interleaved analog-to-digital converter (ADC). As shown in FIG. 1A, an analog voltage $V_a$ is sampled by track-and-hold amplifiers 102A–102P. The track-and-hold amplifiers 102A–102P are clocked by clocks $f_{adcA}$–$f_{adcP}$, as shown in the figure. The outputs of the track-and-hold amplifiers 102A–102P are inputted to sub-analog-to-digital converters 104A–104P, and then to encoders 106A–106P. Demultiplexers 108A–108H input the multiple-phase output digital signals representing a digitized version of the input analog voltage $V_a$ of the corresponding encoders 106A–106P, and output a number of single-phase digital signals, each at a lower rate.

FIGS. 1B–1C illustrate a generalized phase relationship of conventional parallel pipelined circuits. FIG. 1B shows a conventional pipelined parallel operation of either an analog or a digital circuit. Shown in FIG. 1B are three stages "a", "b" and "c" of a device, with each stage having 3 sampling devices M (Ma, Mb, Mc), 3 analog or digital circuits A (Aa0–Aa2, Ab0–Ab2, Ac0–Ac2), clocked by the clock signals f0–f2 (note that only 3 devices in each stage are shown), with the data outputs sa0–sa2, sb0–sb2, sc0–sc2. Clocked sampling devices Mx are necessary. Common examples of Mx are track-and-hold (T/H) in the analog domain and D flip-flop (DFF) in the digital domain. FIG. 1C shows a relationship between the clock phase and signal phase—in other words, the clock is a multiple phase single rate clock.

The problem with this approach is that the slow running block in the backend limits the system clock frequency. The circuit bandwidth of the Ax blocks naturally reduces from the front-end to the backend as the block functionality increases toward the backend. However, the front-end bandwidth can not be scaled-down to match the slow clock, because the front-end has to track the fast varying signal, and/or the matching or noise (kT/C) requirements may prevent the scaling. The front-end is usually the bottleneck in mismatch and noise because of the signal amplification in the front-end stage.

More granularity in the clock rate is therefore needed to improve the efficiency for a given throughput. Accordingly, there is a need in the art for high bandwidth architectures that utilize an architectural approach to solving the bandwidth problem.

SUMMARY OF THE INVENTION

The present invention relates to a hierarchical pipelined parallel operation of analog/digital circuits that substantially obviate one or more of the disadvantages of the related art.

More particularly, in an exemplary embodiment of the present invention, a hierarchical pipelined parallel circuit includes a first stage comprising a first plurality of sampling devices and a plurality of corresponding analog circuits receiving an analog voltage; a second stage comprising a second plurality of sampling devices and a plurality of corresponding analog circuits receiving outputs from the first stage; and a multi-frequency multi-phase clock for the first and second stages. The clock frequency multiplied by the number of parallel devices in each stage is the throughput of the circuit and therefore should preferably be kept constant across the stages. The number of devices in the second stage is greater than the number of devices in the first stage, and the second frequency is lower than the first frequency. Phases of the clocks for the devices in each of the stages are related to each other by 360°/number of devices in each stage.

In another embodiment, a hierarchical pipelined parallel circuit, includes a first stage with a plurality of sampling circuits and a plurality of corresponding analog circuits that receive an output from the plurality of sampling circuits. A second stage includes a second plurality of sampling circuits and a plurality of corresponding analog circuits that receive an output from the plurality of sampling circuits. A multi-frequency, multi-phase clock clocks the first and second stages, the multi-frequency, multi-phase clock providing a first clock having a first frequency having a single or plurality of phases and a second clock having a second frequency having a plurality of phases. The number of devices in the second stage is greater than the number of devices in the first stage. A first phase of a plurality of phases is phase locked to the first phase of the first clock. The second frequency is lower than the first frequency. The clock frequency multiplied by the number of parallel devices in each stage is the throughput of the circuit and therefore should preferably be kept constant across the stages. Phases of the clocks for the devices in each of the stages are related to each other by 360°/number of devices in each stage. The phases can be equally spaced around 360°. The phases can be unequally spaced around 360°. The hierarchical pipelined parallel circuit can be an analog circuit. The hierarchical pipelined parallel circuit can be an analog to digital conversion circuit. The plurality of sampling circuits can be sample-and-hold circuits and the analog circuit is a programmable gain amplifier (PGA) preceding a time-interleaved ADC array.

In another embodiment, an analog-to-digital converter includes N track-and-hold amplifiers inputting an analog voltage and sampling the analog voltage using a N-phase clock; M sub-analog-to-digital converters receiving voltages from the track-and-hold amplifiers and sampling the voltages using an M phase clock having a frequency N/M compared to the N-phase clock; P encoders receiving outputs of the sub-analog-to-digital converters and encoding the outputs using a P phase clock having a frequency M/P of the compared to the M phase clock; and R demultiplexers retime the P different phase outputs from the P encoders and outputting R single-phase digital outputs representing the analog voltage and having a rate P/R each compared to the P-phase clock. In one embodiment, M/N=2. In one embodiment, P/M=2. In each signal path following the track-and-hold amplifiers, there is a programmable gain amplifier. In each signal path to each sub-analog-to-digital converter, a track-and-hold amplifier is clocked by the same clock as its corresponding sub-analog-to-digital converter, and there is a second programmable gain amplifier. In each signal path to a corresponding encoder, there is a D flip-flop for each encoder input bit signal clocked by the same clock as the corresponding encoder. In each signal path following a corresponding encoder, there is a D flip-flop for each encoder output bit signal clocked by the same clock as the corresponding encoder. In half of the signal paths following the encoders, there is a delay latch following the encoder output D flip-flop and clocked by the same clock as the corresponding encoder.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings.

Figure 2:
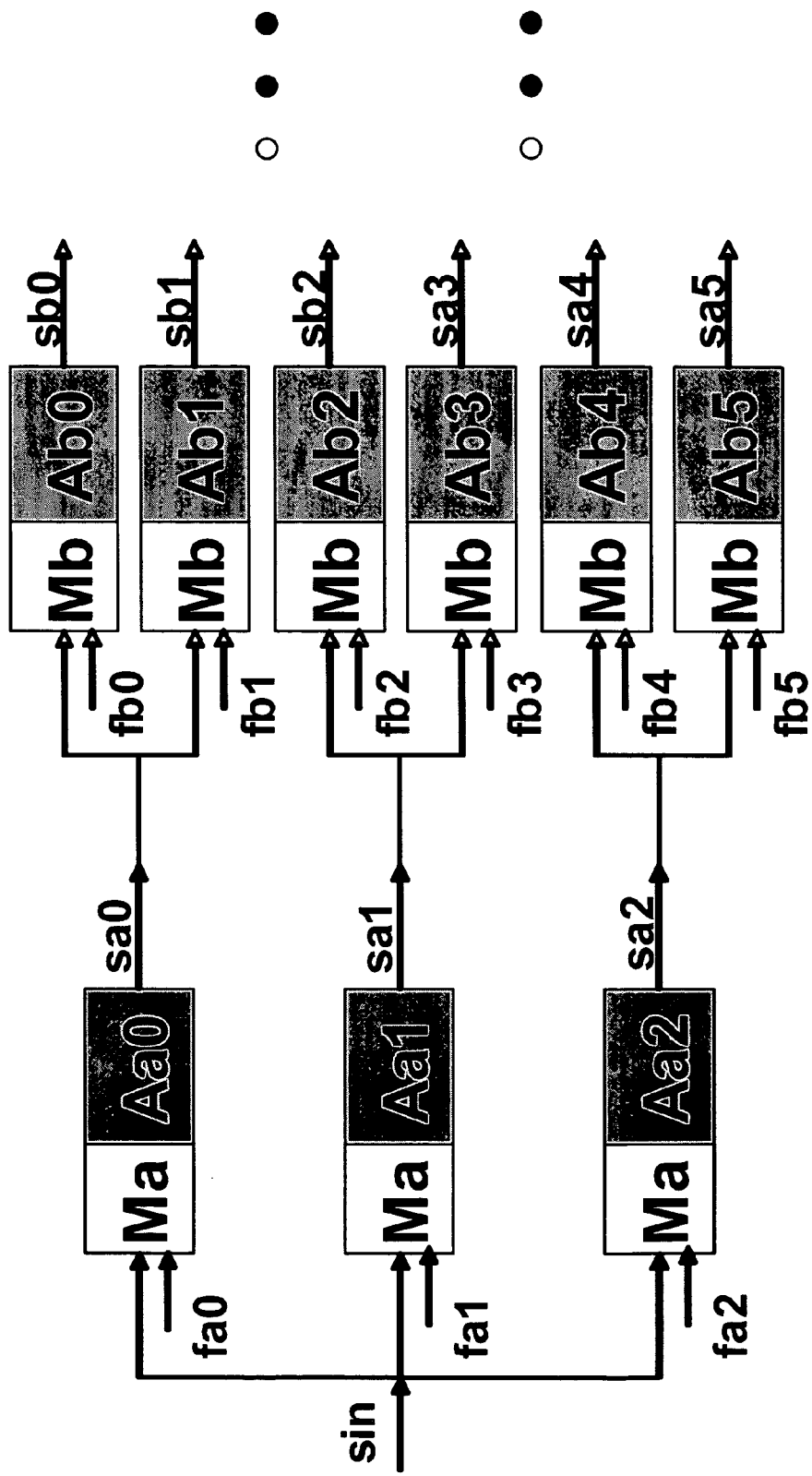
FIGS. 2–3 illustrate a generalized embodiment of the present invention.

FIG. 2 shows the present invention in a generalized form. Shown in FIG. 2 are two stages "a" and "b" (of what can be a parallel hierarchy with more than two stages) of a device, with each stage having sampling devices M (Ma, Mb), analog or digital circuits A (Aa0–Aa2, Ab0–Ab5), clocked by the clock signals fa0–fa2 and fb0–fb5, with the data outputs sa0–sa2 and sb0–sb5, as shown in the figure. It will be appreciated that the number of devices in each stage is not limited to what is shown in FIG. 2.

Figure 3:
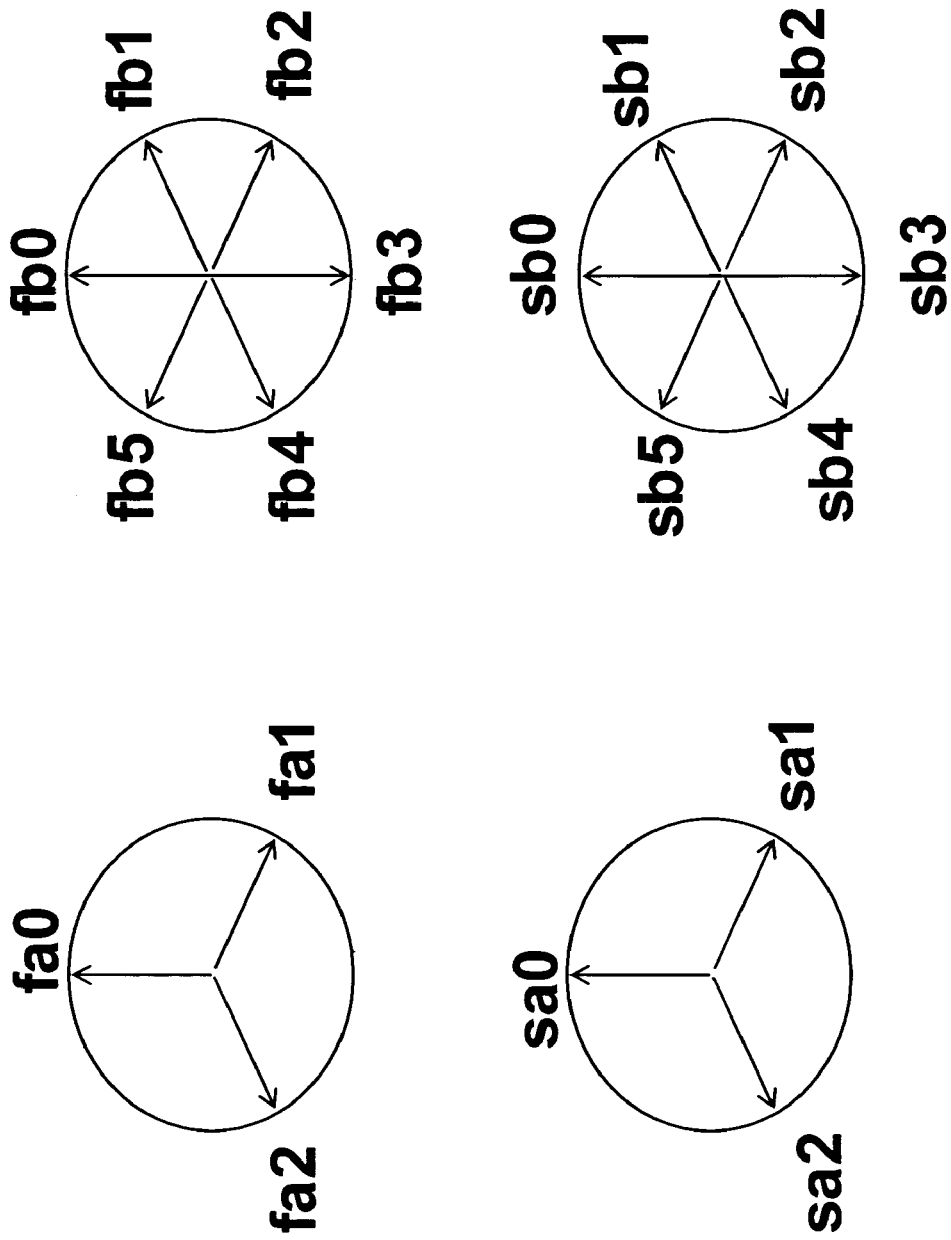

The phase and frequency relationships between the various signals are illustrated in FIG. 3.

Figure 4:
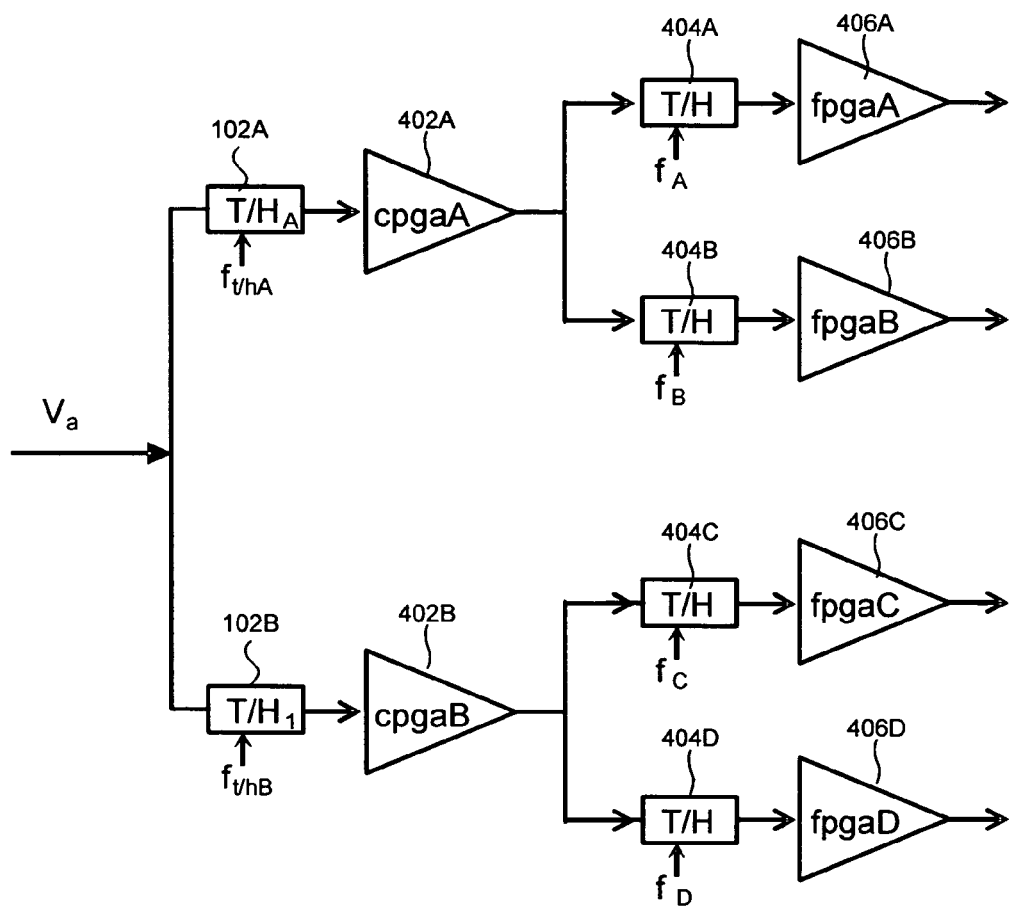
FIG. 4 illustrates an exemplary programmable gain amplifier embodiment of the invention.

FIG. 4 illustrates how the multi-frequency multi-phase clock approach of FIGS. 2–3 may be applied to a programmable gain array, which, for example, can be one element of an ADC. Shown in FIG. 4 is a first stage comprising track-and-holds 102 and driven by the track-and-hold clock $f_{t/hA}$, $f_{t/hB}$. Outputs of the track-and-holds 102 are inputted into coarse programmable gain amplifiers 402A, 402B, and then to a second stage. In the second stage, each signal path has its own track-and-hold 404 driven by a different clock of a frequency f, and phases A–D, and a follow-on fine PGAs 406A–D.

This way, the back-end circuitry can be clocked at a lower speed, while the front-end circuitry can be clocked at a higher speed, while maintaining a high conversion speed of the overall ADC. It also means that the number of back-end devices in an ADC, such as encoders and demultiplexers, does not need to equal the number of front-end devices, such as track-and-hold amplifiers and ADCs. In other words, a hierarchical structure results. There are fewer elements on the front-end, and the number of elements grows as the signal moves through the stages towards the back-end. This has the advantage that power consumption and area is substantially reduced. Note also that the front-end circuitry tends to consume more power than the back-end, therefore, reducing the amount of front-end circuitry has a disproportionately beneficial effect on the overall power and area requirements of the device.

Figure 1A:
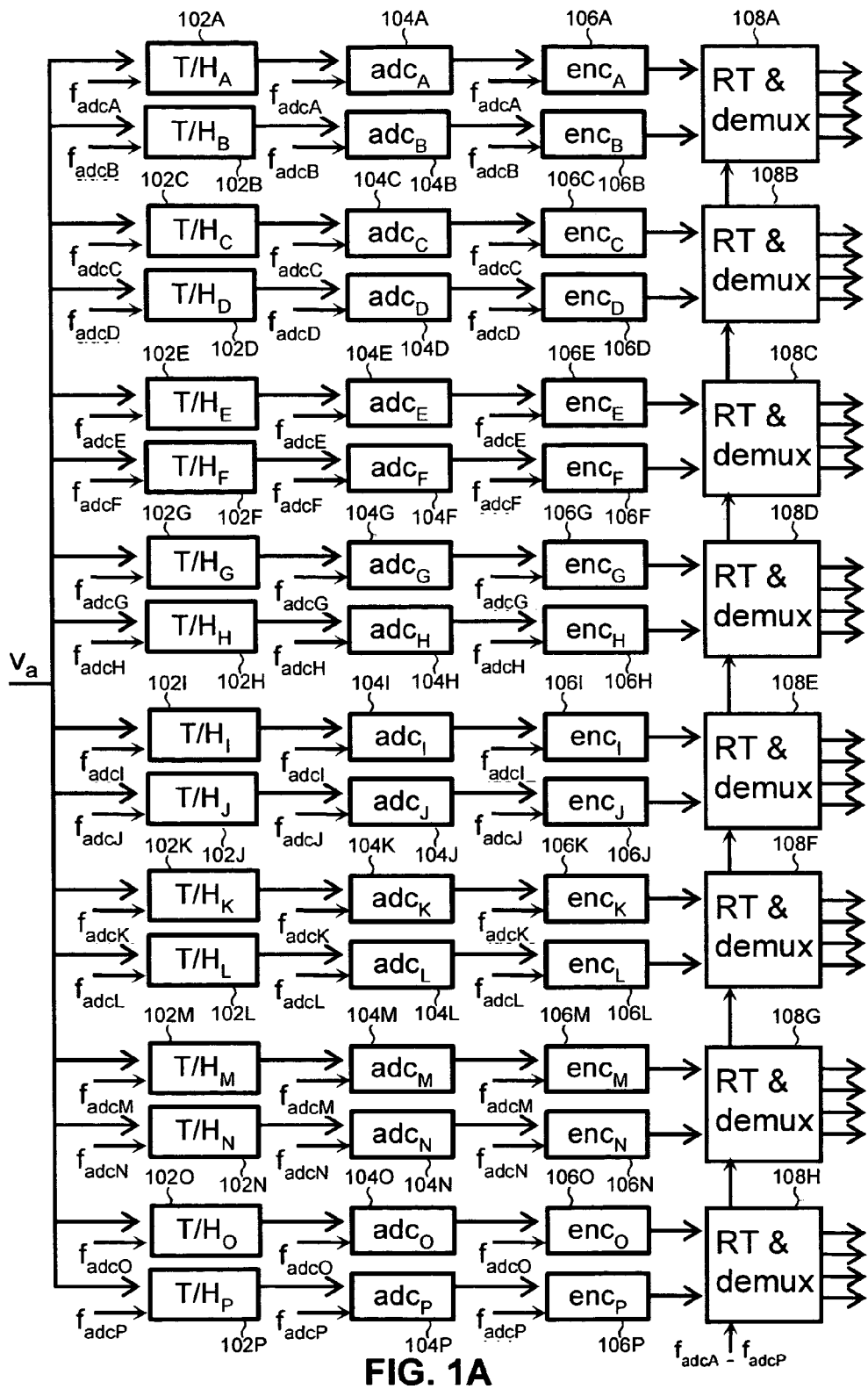
FIG. 1A illustrates a conventional time interleaved ADC.
Figure 1B:
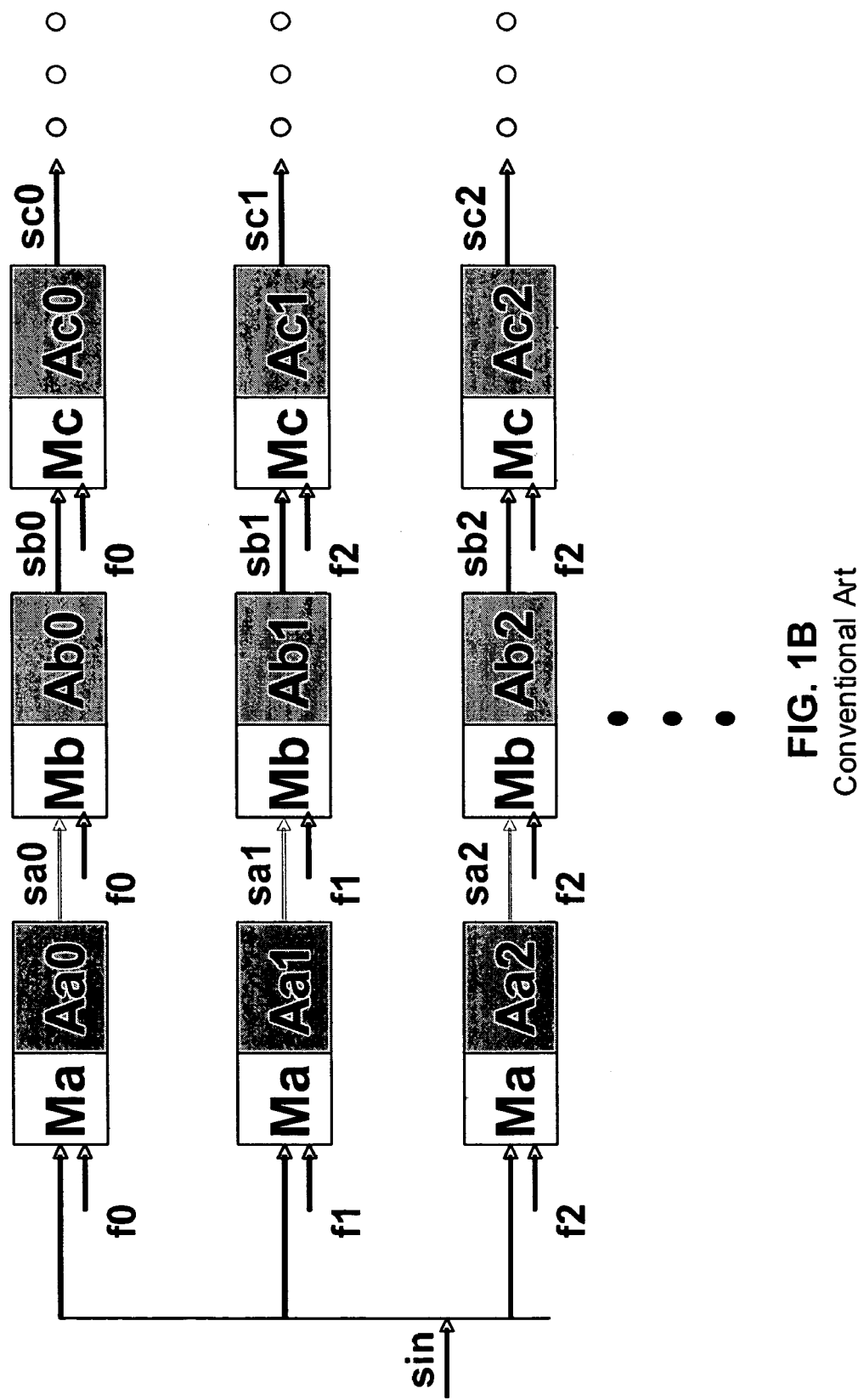
FIGS. 1B–1C illustrate a generalized phase relationship in of conventional parallel circuits.
Figure 1C:
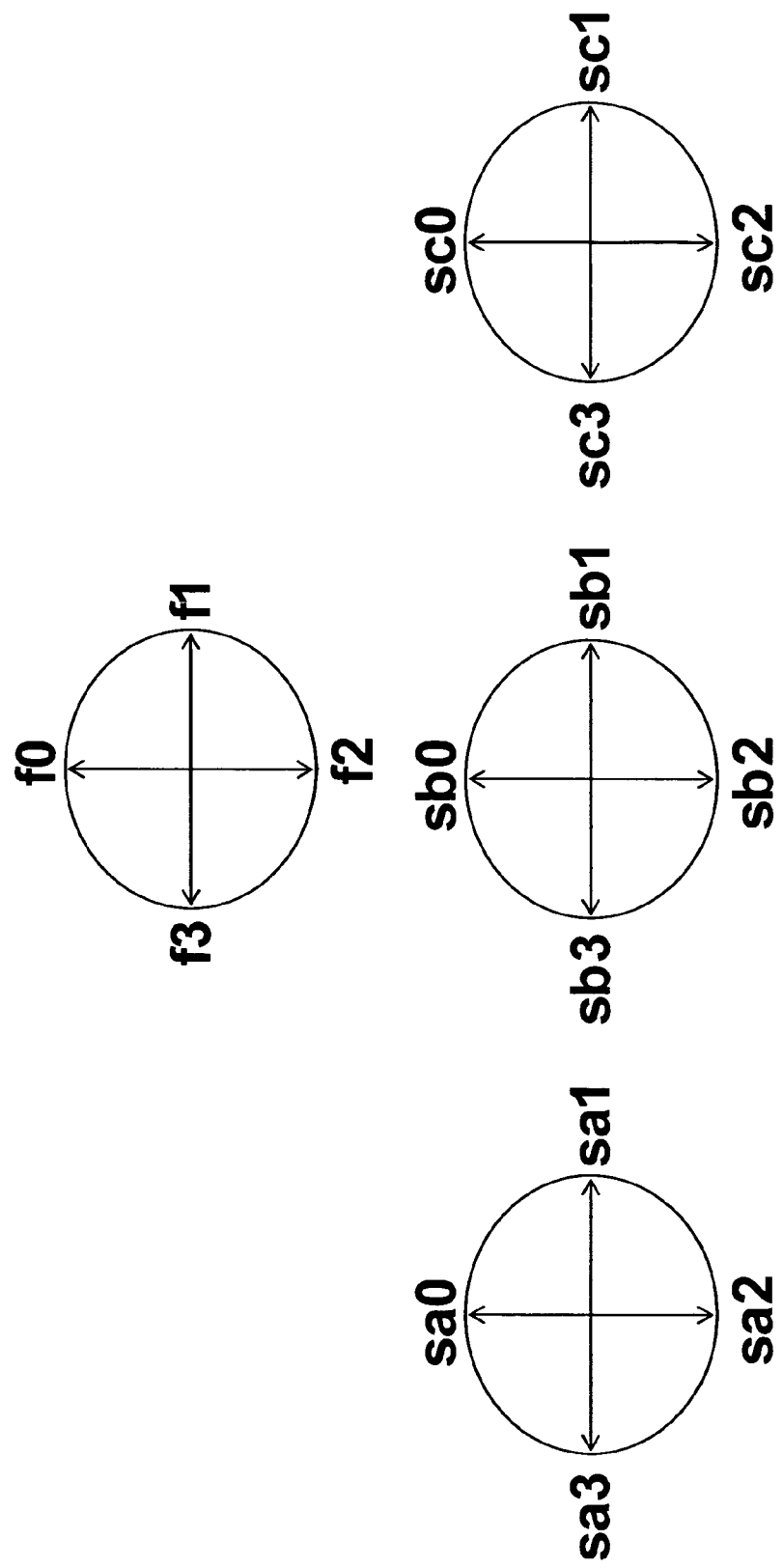

Another benefit of this approach is that mismatch between the signal lines, and the mismatch between the clock lines, can be reduced or eliminated. For example, with reference to conventional circuit shown in FIG. 1A, there may be mismatch between the signal going through the signal path of the track-and-hold 102A, sub-ADC 104A and encoder 106A, and a signal going through the track-and-hold 102P, ADC 104P and encoder 106P.

Another way of looking at this approach is that granularity of the overall structure is increased using the hierarchical approach by using a higher granularity of the clock frequency. Note also that the spacing of phases around the unit circle can be equally spaced, or can be unequally spaced. Thus, the number of devices in the second stage is greater than the number of devices in the first stage. Normally, in each stage, one of the phases is phase locked to a phase of the clock of the previous stage, while its frequency is slower than the frequency of the clock of the previous stage. A ratio of clock frequencies of the stages corresponds to a ratio of devices in the stages. Usually phases of the clocks for the devices in each of the stages are related to each other by 360°/number of devices in each stage.

The present invention will be further illustrated with reference to a pipelined ADC, which is a particular example of the pipelined hierarchical architecture illustrated in FIGS. 2–4. Using the parallel pipelined concepts described above, the approach of the present invention is to divide the ADC into smaller blocks, so as to avoid the back-end bandwidth limitations, and to implement it by time-interleaving an array of pipelined analog or digital blocks. Clocked sampling devices are therefore used. Common examples of such devices are track-and-hold amplifiers in analog domain, and D flip-flops in the digital domain.

Figure 5:
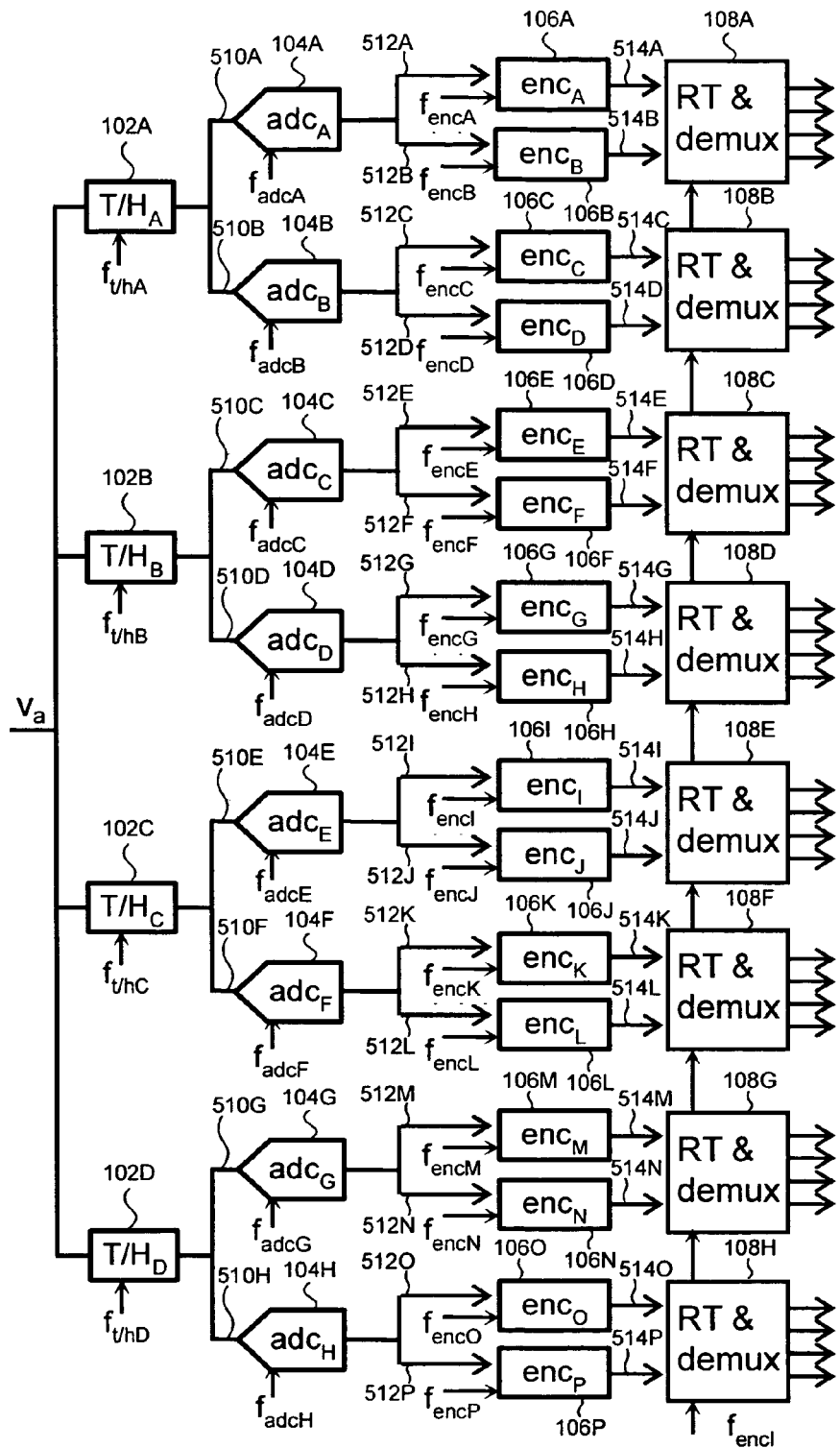
FIG. 5 illustrates an exemplary analog to digital converter embodiment of the invention.

FIG. 5 illustrates one ADC-related embodiment of the present invention, which is a particular example of how the general principles described above with reference to FIGS. 2–4 can be applied. Shown in FIG. 5 is a hierarchical parallel structure of an analog-to-digital converter, which includes four track-and-holds 102A–102D, eight sub-ADCs 104A–104H, sixteen encoders 106A–106P and eight demultiplexers 108A–108H. It will be appreciated that the number parallel channels, as well as the hierarchical ratios between the stages, are exemplary.

An analog signal $V_a$ is sampled by four track-and-hold amplifiers 102A–102D. The sampling is performed at different phases. The clock signals provided to the track-and-hold amplifiers 102A–102D are spaced apart from each other by 90°, or one quarter of the period (here, 360° divided by the number of track-and-hold amplifiers). This is an example of time interleaving. Note that the clock frequencies $f_{t/h}$–$f_{t/hD}$ supplied to the track-and-hold amplifiers 102A–102D are the same, but the phase is different. The outputs of the track-and-holds 102A–102D are then split, in this case into two signals 110A, 110B that are fed into two sub-ADCs. For example, taking the case of the track-and-hold 102A, its output (110A, 110B) goes to sub-ADC 104A and sub-ADC 104B. The two sub-ADCs 104A, 104B are clocked at half the frequency of the track-and-hold, and their clock waveforms $f_{adcA}$, $f_{adcB}$ are at 180° relative to each other. In other words, the phases of the clocks of the two sub-ADCs 104A, 104B are complementary. At the end of the clock period of the track-and-hold 102A ($f_{t/hA}$), the output 510B of the track-and-hold 102A is sampled by the sub-ADC 104B. At the end of the next period, the output 510A of the track-and-hold 102A is sampled by the sub-ADC 104A.

In the next stage, the output of each sub-ADC is split up again. For example, the output of the sub-ADC 104A (512A, 512B) is sampled by encoders 106A, 106B, respectively. The clock inputs $f_{encA}$, $f_{encB}$ to the two encoders 106A, 106B are similarly one half of the clock input to the sub-ADC 104A, and are complementary in phase. The outputs 514A, 514B of the two encoders 106A, 106B, respectively, are fed into a 2-to-4 demultiplexer 108A, which retimes the two input digital signals with one of the clock phases $f_{encA}$–$f_{encP}$, e.g., $f_{encI}$, as shown in FIG. 5, and de-multiplexes them into four parallel outputs at half the input rate. (The RT in block 108A stands for "retimer").

The output data at the outputs of the encoders 106A–106P has different phases, therefore, it needs to be retimed to the same phase, which the retimer and demultiplexer blocks 108A–108H accomplish. The remainder of the circuit shown in FIG. 5 works based on the same principles as described above.

In the circuit of FIG. 5, the encoders 106 and the demultiplexers 108 may be viewed as the back-end, and the track-and-holds 102 and the ADCs 104 may be viewed as the front-end.

Note that the demultiplexers in blocks 108 can be used recursively, for example, to convert 32 to 64 parallel outputs, etc. Note also that the parallel output signals of the first three stages of the circuit of FIG. 5 have different phases, while the outputs of the last stage, the demultiplexers, are all retimed to a single phase. All the signals are locked in phase relative to each other. In other words, there is no need to retime the data between each stage of the circuit. Note also that the output of any one of the encoders 106 can be "first", or second, etc., given that the phases of their clock inputs $f_{enc}$ vary.

Figure 6B:
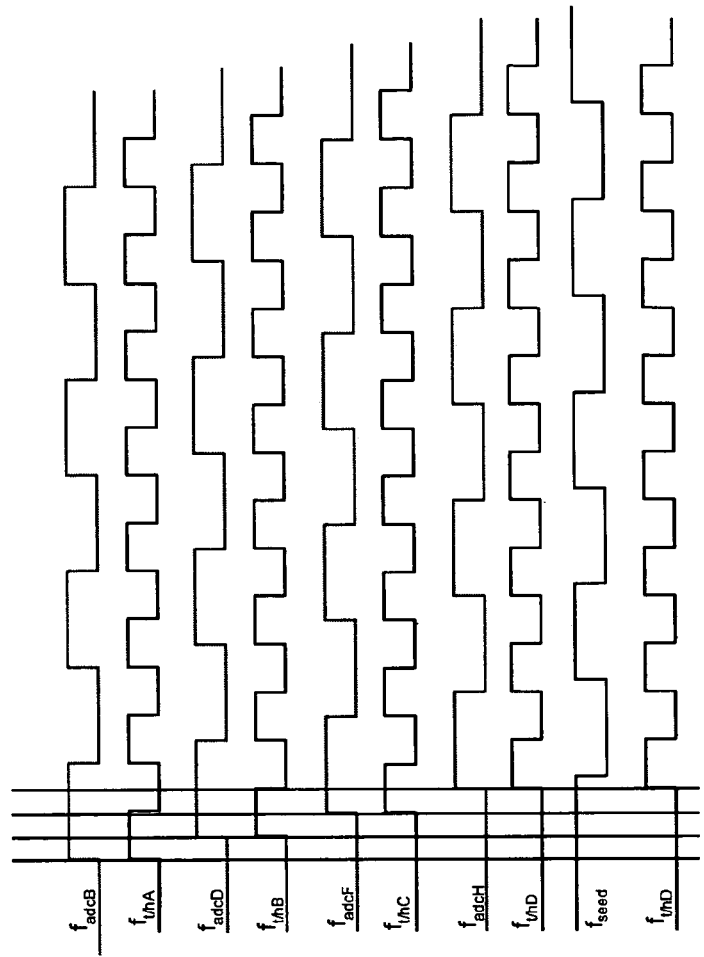
FIGS. 6A–6B illustrate how a multi-phase multi-frequency clock can be generated and used.
Figure 6A:
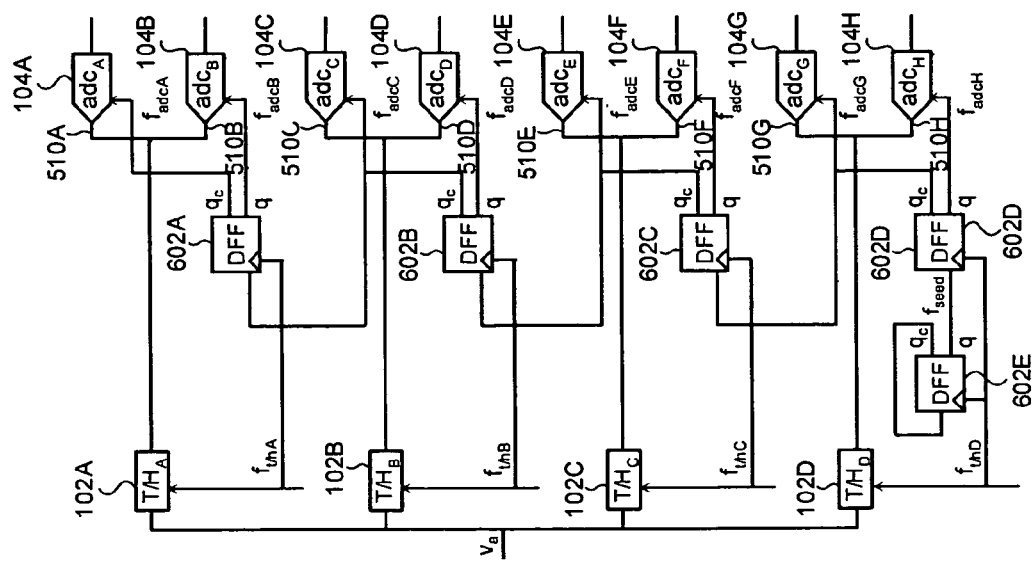

Thus, the circuit of FIG. 5 uses a multi-phase, multi-frequency clock. FIGS. 6A and 6B illustrate how such a clock can be generated, although the invention is not limited to this particular method of generating clock waveforms, and other mechanisms may be utilized. As shown in FIG. 6A, D flip-flops 602A–602E can be added to the circuit, between the track-and-holds 102A–102D and the sub-ADCs 104A–104H, connected as shown. The track-and-holds 102A–102D are driven by a single frequency four phase clock $f_{t/ho}$–$f_{t/h3}$, which can be generated, for example, by a ring oscillator. At the sub-ADC stage, an eight phase clock running at half the rate is needed. The D flip-flops 602A–602E, arranged as shown in FIG. 6A, provides such a clock. FIG. 6B shows the wave forms of the clocks $f_{t/h}$ and $f_{adc}$.

Although not shown in figures, the clocks $f_{enc}$ for the encoder stage 106 can be derived in the same manner, using D flip-flops and driven by clock outputs $f_{adc}$ of the D flip-flops 602A–602E shown in FIG. 6A.

Figure 6C:
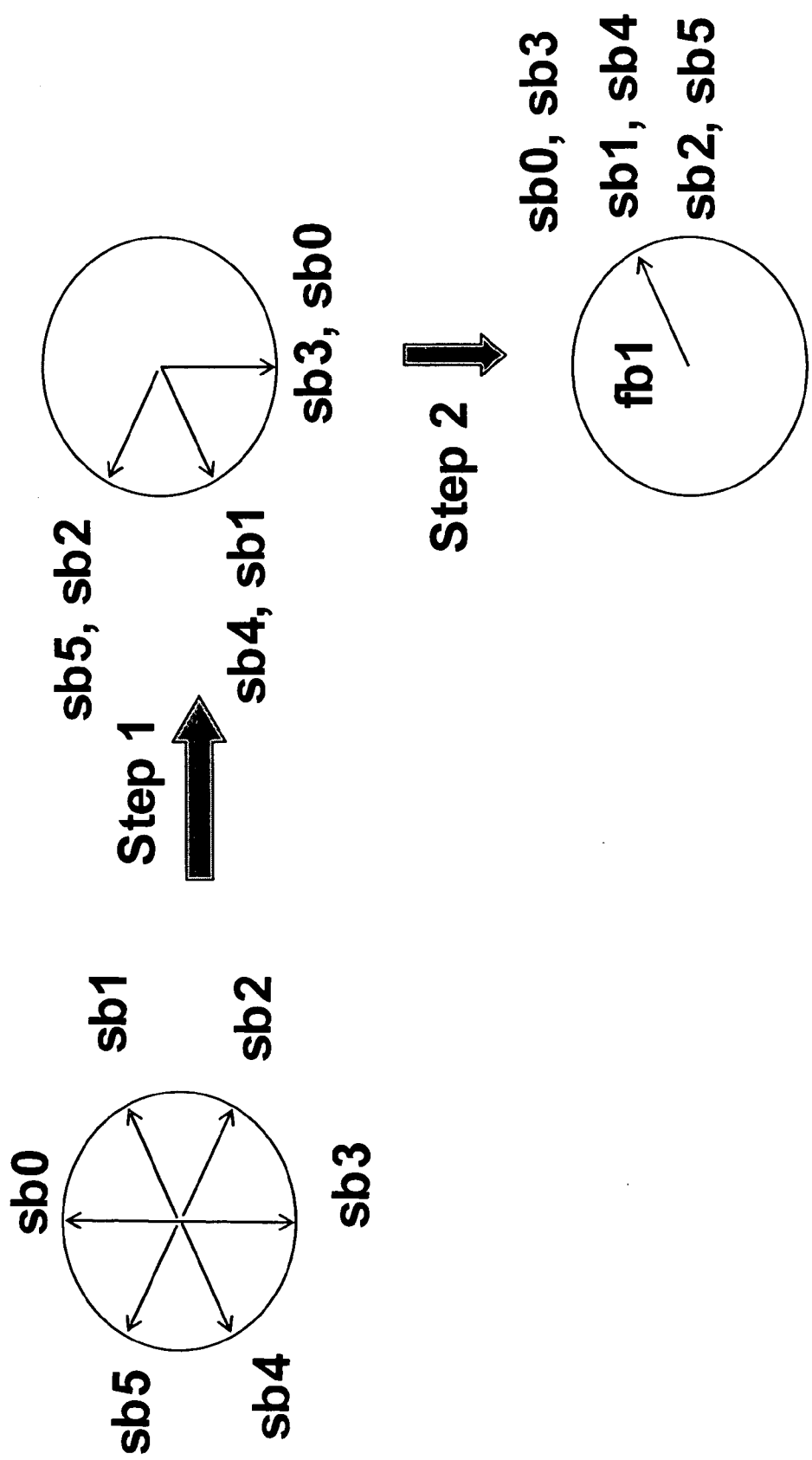
FIG. 6C illustrates how the multi-phase parallel signals are retimed to a single phase.

The multi-phase signals are retimed into single phase as follows (see illustration in FIG. 6C, for the case of 3 track-and-holds and six sub-ADCs): step one: retime the outputs of half of the channels with their respective complement clocks, so that each complementary pair of outputs is aligned in phase. For example, sb0, sb1, sb2 are retimed by fb3, fb4 and fb5 respectively, as is shown in FIG. 6C.

Step two: retime the outputs that have been aligned to the complementary phases with an original clock phase, preferably the middle one of the original phases, for equal setup and hold time margin. For example, the 6 data in three phases shown in FIG. 6C are retimed with fb1 the middle phase among fb0, fb1 and fb2. In other words, the diagram in FIG. 6C illustrates output data retiming. Note that only three distinct clock phases are necessary, with the other three (of the six) generated by inverting the clock waveform.

Thus, with this clocking approach, phase ambiguity is avoided, though the parallel data signals have different phases before the retiming (phase-alignment). The advantage is that there is no need to put an additional retiming block in each signal path of the first stage. This eliminates the overhead and signal degradation associated with such retiming circuitry in the front end of the signal path. Also, there is no need to use a reset to resolve the phase ambiguity.

Note also that although the architecture is easy to implement when it consists of a binary tree structure, the number of parallel operations in each hierarchy can be any increasing integer from the front-end to the backend. The number of hierarchies can be any integer. The multi-phase multi-rate clock generation can be used recursively to generate more than 2× clocks for an immediately lower hierarchy.

Figure 7:
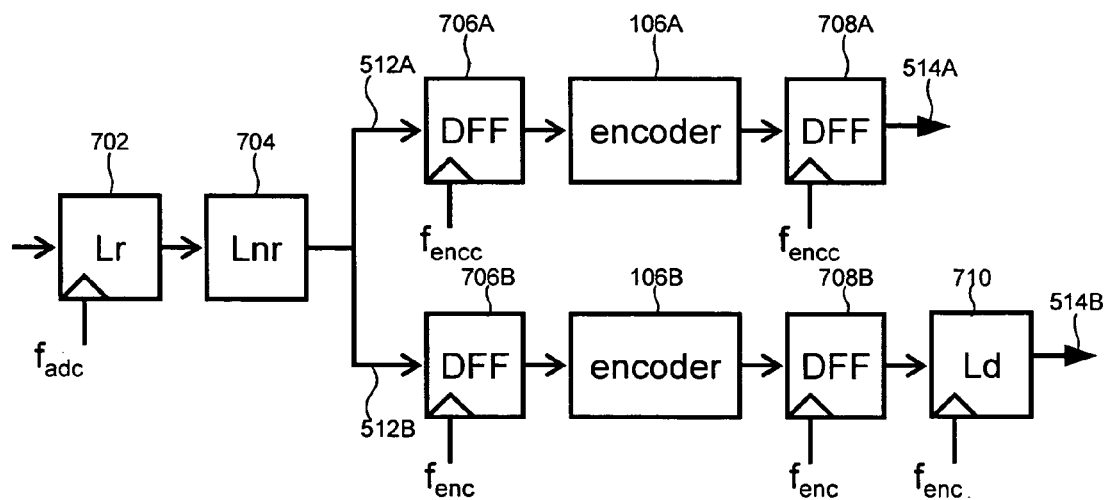
FIG. 7 illustrates the interleaving approach between the second stage and the third stage of the ADC hierarchy.

FIG. 7 illustrates the interleaving approach between the second stage and the third stage of the ADC hierarchy. The input in the circuit of FIG. 7 is from any one of the sub-ADCs, for example, sub-ADC 104A. The signal is fed into a comparator regenerative latch 702 with reset. It is then fed into a non-reset digital latch 704, and then split up into two signals 512A, 512B that are fed into D flip-flops 706A, 706B, which are clocked by complementary phase clocks $f_{enc}$, $f_{encc}$. The outputs of the D flip-flops 706A, 706B, are inputted into the encoders 106A, 106B, and then to D flip-flops 708A, 708B. The output of the second D flip-flop 708B is also latched by a digital (half clock) delay latch 710. The comparator regenerative latch 702 and the non-reset digital latch 704 may also be viewed as the last block of the sub-ADC 102. Note that in the case of the latch 702, the previous sample needs to be reset, so that the next sample can be latched. The non-reset latch 704 is analogous to a data latch, and does not need to be reset. The output of the latch 704 is sampled by the D flip-flops 706A, 706B. The outputs of the encoders 106A, 106B are sampled by the D flip-flops 708A, 708B. Note that at the outputs of the circuit in FIG. 7 are both clocked to the same clock $f_{encc}$. In other words, after the operation of the latches, the data in all the paths is retimed (phase-aligned). It should be noted that the output of the retimed path corresponds to the input sample received earlier than the path that had not been retimed.

The presence of the latches in a circuit of FIG. 7 reduces problems with the meta-stability associated with the comparator regenerative latch 702.

Figure 8:
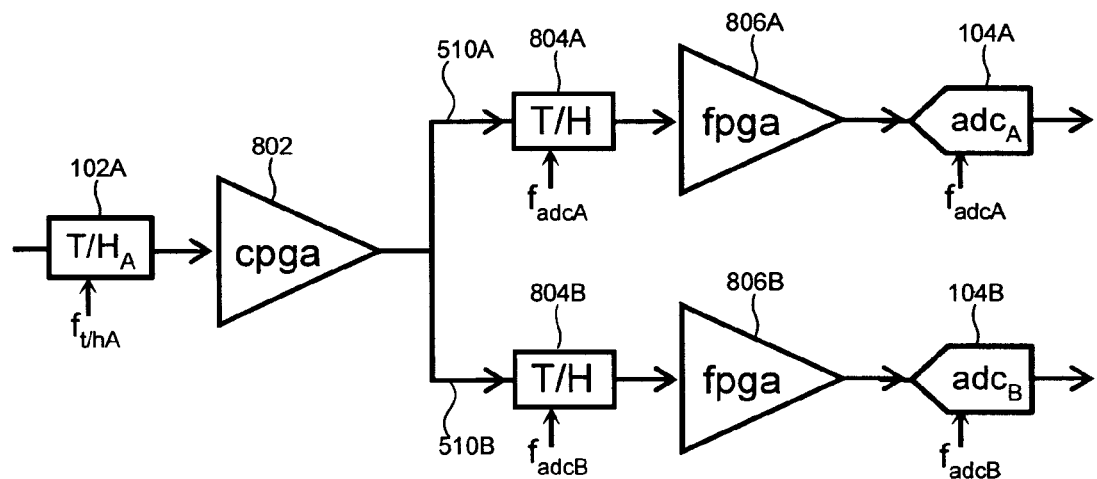
FIG. 8 illustrates how the signal travels from a first stage of the ADC hierarchy to the second stage of the ADC hierarchy.

FIG. 8 illustrates an example of how the signal travels from the first stage of the hierarchy to the second stage of the hierarchy. As shown in FIG. 8, the output of the track-and-hold 102A is fed into a coarse programmable gain amplifier 402, which then splits the signal into 510A, 510B and feeds it into two track-and-hold amplifiers 404A, 404B, which are clocked by the same clock ($f_{adcA}$, $f_{adcB}$) as their corresponding sub-ADC (here, 104A, 104B). The outputs of the track-and-holds 404A, 404B are fed into fine programmable gain amplifiers 406A, 406B, respectively, and then to the sub-ADCs 104A, 104B. Note that the clock signals $f_{adcA}$ and $f_{adcB}$ are phase compliments of each other. The presence of the programmable gain amplifiers 402, 406 allows reducing gain mismatch between the various signal paths.

In the present invention, because the overall area is reduced, and the number of devices (e.g., track-and-hold amplifiers, sub-ADCs, etc.) is reduced, the devices can be packed closer together, reducing mismatch. The mismatch can be a gain mismatch, an offset mismatch, or a timing mismatch. Of the three mismatches, the timing mismatch, or the sampling clock mismatch, is usually the most troublesome one. However, once the signal is sampled, the timing after that point becomes essentially irrelevant. Therefore, reducing the number of track-and-holds on the front-end reduces the timing mismatch problems. Additionally, the front-end circuitry, at current technology, can be clocked at multi-gigahertz speeds, which is at present virtually unachievable for the digital encoders and digital signal processors (DSPs) that the ADC outputs are usually fed to (but which only need to run at a fraction of the speeds of the front-end).

Although the particular embodiment described above is primarily in terms of an ADC, it will be appreciated that the invention is not limited to this application, but may be used in any application that requires parallel pipelined operation. For example, the invention may be used in telecommunication circuits (e.g., in SERDES, or serializer-deserializer, circuits, in digital processors, or any discrete-time analog, digital, or analog/digital circuits).

It should also be appreciated that various modifications, adaptations, and alternative embodiments thereof may be made within the scope and spirit of the present invention. The invention is further defined by the following claims.

What is claimed is:

1. A hierarchical pipelined parallel circuit comprising:
   a first stage comprising a first plurality of sampling circuits and a plurality of corresponding analog circuits receiving a signal;
   a second stage comprising a second plurality of sampling devices and a plurality of corresponding analog circuits receiving outputs from the first stage; and
   a multi-frequency multi-phase clock clocking the first and second stages,
   wherein the number of devices in the second stage is greater than the number of devices in the first stage.

2. The circuit of claim 1, wherein a ratio of clock frequencies of the first and second stages corresponds to a ratio of devices in the first and second stages so that the circuit throughput, which is equal to the clock frequency multiplied by the number of devices in each stage, is kept constant.

3. The circuit of claim 2, wherein phases of the clocks for the devices in each of the stages are related to each other by 360°/number of devices in each stage.

4. A hierarchical pipelined parallel circuit, comprising:
   a first stage comprising a plurality of sampling circuits and a plurality of corresponding analog circuits that receive an output from the plurality of sampling circuits;
   a second stage comprising a second plurality of sampling circuits and a plurality of corresponding analog circuits that receive an output from the plurality of sampling circuits; and
   a multi-frequency, multi-phase clock clocking the first and second stages, the multi-frequency, multi-phase clock providing a first clock having a first frequency having at least one phase and a second clock having a second frequency having a plurality of phases;
   wherein the number of devices in the second stage is greater than the number of devices in the first stage; and
   wherein a first phase of the second frequency is phase locked to the first phase of the first clock, and wherein the second frequency is slower than the first frequency.

5. The circuit of claim 4, wherein a ratio of clock frequencies of the first and second stages corresponds to a ratio of devices in the first and second stages so that the circuit throughput, which is equal to the clock frequency multiplied by the number of devices in each stage, is kept constant.

6. The circuit of claim 4, wherein phases of the clocks for the devices in each of the stages are related to each other by 360°/number of devices in each stage.

7. The circuit of claim 6, wherein the phases are equally spaced around 360°.

8. The circuit of claim 6, wherein the phases are unequally spaced around 360°.

9. The circuit of claim 4, wherein the sampling circuits comprise N track-and-hold amplifiers inputting an analog voltage and sampling the analog voltage using the first clock, wherein the first clock is an N-phase clock.

10. The circuit of claim 9, wherein the analog circuits comprise:
    M sub-analog-to-digital converters receiving voltages from the track-and-hold amplifiers and sampling the voltages using the second clock, wherein the second clock is an M phase clock having a frequency N/M compared to the N-phase clock;
    P encoders receiving outputs of the sub-analog-to-digital converters and encoding the outputs using a P phase clock having a frequency M/P of the compared to the M phase clock; and
    a plurality of demultiplexers retiming and de-multiplexing the outputs of the encoders.

11. The analog-to-digital converter of claim 10, further comprising, in each signal path following the track-and-hold amplifiers, a programmable gain amplifier.

12. The analog-to-digital converter of claim 10, further comprising:
    in each signal path to each sub-analog-to-digital converter, a track-and-hold amplifier clocked by the same clock as its corresponding sub-analog-to-digital converter, and a second programmable gain amplifier.

13. The analog-to-digital converter of claim 10, further comprising, in each signal path following a corresponding sub-analog-to digital converter:
    a digital reset latch; and
    a digital non-reset latch.

14. The analog-to-digital converter of claim 13, further comprising, in each signal path to a corresponding encoder, a D flip-flop clocked by the same clock as the corresponding encoder.

15. The analog-to-digital converter of claim 14, further comprising, in each signal path following each encoder, a D flip-flop clocked by the same clock as the corresponding encoder.

16. The analog-to-digital converter of claim 15, further comprising, in half of the signal paths following the encoders, delay latch following the D flip-flop and clocked by the same clock as the corresponding encoder.

17. The circuit of claim 4, wherein the hierarchical pipelined parallel circuit is an analog circuit.

18. The circuit of claim 4, wherein the hierarchical pipelined parallel circuit is an analog to digital conversion circuit.

19. The circuit of claim 4, wherein the plurality of sampling circuits are sample and hold circuits and wherein the analog circuit is a programmable gain amplifier (PGA).

20. An analog-to-digital converter comprising:
  N track-and-hold amplifiers inputting an analog voltage and sampling the analog voltage using a N-phase clock;
  M sub-analog-to-digital converters receiving voltages from the track-and-hold amplifiers and sampling the voltages using an M phase clock having a frequency N/M;
  P encoders receiving outputs of the sub-analog-to-digital converters and encoding the outputs using an P phase clock having a frequency M/P; and
  a plurality of demultiplexers retiming and de-multiplexing the outputs of the encoders.

21. The analog-to-digital converter of claim 20, wherein M/N=2.

22. The analog-to-digital converter of claim 20, wherein P/M=2.

23. The analog-to-digital converter of claim 20, further comprising a frequency-divide-by-2 circuit and, corresponding to each N-phase clock, a D flip-flop,
  wherein the frequency-divide-by-2 circuit divides the frequency of the latest phase of the N-phase clock and feeds the output to the D flip-flop corresponding to the latest-phase clock,
  wherein each D flip-flop is clocked by its corresponding N-phase clock,
  wherein a complementary output of each D flip-flop is fed to the D flip-flop corresponding to the adjacent early phase, and
wherein complimentary outputs of each D flip-flop form the M-phase clock driving the sub-analog-to-digital converters.

24. The analog-to-digital converter of claim 20, further comprising a frequency-divide-by-2 circuit and, corresponding to each M-phase clock, a D flip-flop,
  wherein the frequency-divide-by-2 circuit divides the frequency of the latest phase of the M-phase clock and feeds its output to the D flip-flop corresponding to the latest-phase clock,
  wherein each D flip-flop is clocked by its corresponding M-phase clock,
  wherein a complementary output of each D flip-flop is fed to the D flip-flop corresponding to the adjacent early phase, and
wherein complimentary outputs of each D flip-flop form the P-phase clock driving the encoders.

25. The analog-to-digital converter of claim 20, further comprising, in each signal path following the track-and-hold amplifiers, a programmable gain amplifier.

26. The analog-to-digital converter of claim 25, further comprising:
  in each signal path to each sub-analog-to-digital converter, a track-and-hold amplifier clocked by the same clock as its corresponding sub-analog-to-digital converter, and a second programmable gain amplifier.

27. The analog-to-digital converter of claim 20, further comprising, in each signal path following a corresponding sub-analog-to digital converter:
  a digital reset latch; and
  a digital non-reset latch.

28. The analog-to-digital converter of claim 27, further comprising, in each signal path to a corresponding encoder, a D flip-flop clocked by the same clock as the corresponding encoder.

29. The analog-to-digital converter of claim 28, further comprising, in each signal path following each encoder, a D flip-flop clocked by the same clock as the corresponding encoder.

30. The analog-to-digital converter of claim 29, further comprising, in half of the signal paths following the encoders, delay latch following the D flip-flop and clocked by the same clock as the corresponding encoder.

31. The analog-to-digital converter of claim 20, further comprising, following each track-and-hold amplifier, a D flip-flop,
  wherein the D flip-flops are driven by the same clock as its corresponding track-and-hold amplifier, and
  wherein complimentary outputs of each D flip-flop form the M-phase clock driving the sub-analog-to-digital converters.

32. An analog-to-digital converter comprising:
  a plurality of signal paths from an analog voltage to a plurality of digital signal lines representing the analog voltage, each signal path part of a hierarchy and including a track-and-hold amplifier, a sub-analog-to-digital converter, an encoder, and a multiplexer;
  wherein the track-and-hold amplifiers, the sub-analog-to-digital converters and the encoders are driven by clocks having different frequencies.

33. The analog-to-digital converter of claim 32, further comprising, in each signal path following the track-and-hold amplifiers, a programmable gain amplifier.

34. The analog-to-digital converter of claim 33, further comprising:
  in each signal path to each sub-analog-to-digital converter, a track-and-hold amplifier clocked by the same clock as its corresponding sub-analog-to-digital converter, and a second programmable gain amplifier.

35. The analog-to-digital converter of claim 32, further comprising, in each signal path following a corresponding sub-analog-to digital converter:
  a digital reset latch; and
  a digital non-reset latch.

36. The analog-to-digital converter of claim 35, further comprising, in each signal path to a corresponding encoder, a D flip-flop clocked by the same clock as the corresponding encoder.

37. The analog-to-digital converter of claim 36, further comprising, in each signal path following each encoder, a D flip-flop clocked by the same clock as the corresponding encoder.

38. The analog-to-digital converter of claim 37, further comprising, in half of the signal paths following the encoders, delay latch following the D flip-flop and clocked by the same clock as the corresponding encoder.

39. The analog-to-digital converter of claim 38, further comprising, following each track-and-hold amplifier, a D flip-flop,
- wherein the D flip-flops are driven by the same clock as its corresponding track-and-hold amplifier, and
- wherein complimentary outputs of each D flip-flop form clocks driving corresponding sub-analog-to-digital converters.

40. An analog-to-digital converter comprising:
- a plurality of signal paths from an analog voltage to a plurality of digital signal lines representing the analog voltage, each signal path part of a hierarchy and including a track-and-hold amplifier, a programmable gain amplifier, a sub-analog-to-digital converter, an encoder, and a multiplexer;
- wherein the track-and-hold amplifiers, the sub-analog-to-digital converters and the encoders are driven by clocks having different frequencies.

41. The analog-to-digital converter of claim 40 further comprising:
- in each signal path to each sub-analog-to-digital converter, a second track-and-hold amplifier clocked by the same clock as its corresponding sub-analog-to-digital converter, and a second programmable gain amplifier.

42. The analog-to-digital converter of claim 40, further comprising, in each signal path following a corresponding sub-analog-to digital converter:
- a digital reset latch; and
- a digital non-reset latch.

43. The analog-to-digital converter of claim 40, further comprising, in each signal path to a corresponding encoder, a D flip-flop clocked by the same clock as the corresponding encoder.

44. The analog-to-digital converter of claim 43, further comprising, in each signal path following each encoder, a D flip-flop clocked by the same clock as the corresponding encoder.

45. The analog-to-digital converter of claim 44, further comprising, in half of the signal paths following the encoders, delay latch following the D flip-flop and clocked by the same clock as the corresponding encoder.

* * * * *